US006687050B2

(12) United States Patent
Griggs et al.

(10) Patent No.: US 6,687,050 B2
(45) Date of Patent: Feb. 3, 2004

(54) AMPLIFIER GAIN ERROR

(75) Inventors: Roger D Griggs, Torquay (GB); Barrie Flintham, Totnes (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/109,216

(22) Filed: Mar. 28, 2002

(65) Prior Publication Data

US 2002/0196531 A1 Dec. 26, 2002

(51) Int. Cl.$^7$ .................................................. H01S 3/00

(52) U.S. Cl. ..................... 359/341.4; 359/337

(58) Field of Search ..................... 359/341.4, 341.41, 359/337; 398/181

(56) References Cited

U.S. PATENT DOCUMENTS 6,282,017 B1 * 8/2001 Kinoshita .............. 359/341.42
6,542,291 B1 * 4/2003 Kinoshita et al. ...... 359/341.33

* cited by examiner

Primary Examiner—Mark Hellner
(74) Attorney, Agent, or Firm—Barnes & Thornburg

(57) ABSTRACT

An amplifying module 101 for an optical network has a fiber amplifier 102 for amplifying a multiplexed optical stream having a plurality of wavelength channels. The fiber amplifier 102 has a set point gain. The module 101 has module control means 108 for controlling the operating conditions of the fiber amplifier 102 and supplying means for supplying to the module control means 108 information representative of the channel loading condition. In response to the information, the module control means 108 adjusts the operating conditions of the fiber amplifier 102 such that the fiber amplifier gain does not exceed an acceptable deviation limit away from a set point gain.

20 Claims, 3 Drawing Sheets

AMPLIFIER GAIN ERROR

TECHNICAL FIELD

The invention relates to optical networks and in particular to amplifying modules for such networks.

BACKGROUND ART

In optical telecommunications networks, encoded optical signals are transported generally between transmitters and receivers by optical fibre links. At various locations along the links, usually at nodes or link junctions, the optical signals are amplified so as to compensate for losses incurred during transportation. Typically, the signals are amplified by optical amplifiers such as erbium doped fibre amplifiers (EDFAs).

An EDFA or other fibre amplifier module typically has an input to which an incoming signal for amplification is applied, and an output from which an amplified signals emerges. The EDFA has an active fibre part which comprises an optical fibre doped with erbium and coupled to a source of pump light for exciting the erbium dopant ions. The pump light wavelength is chosen so as to excite electrons within the erbium ions to a level from which, when they transit downwards to a lower energy level, photons of wavelength which is the same as the input signals are emitted. These photons are in phase with and travel in the same direction as the input signal photons, and the net result is an amplified output signal.

With reference to FIG. 1, a known EDFA amplifier module, indicated generally at 1, situated at a node N in an optical fibre link, comprises an EDFA having an erbium doped fibre component 2 including a length of erbium doped fibre (not shown) pumped with light of appropriate wavelength from a semiconductor laser (not shown). The module 1 also comprises control means constituted by control electronics constituted by a signal processor 8 which controls the operating conditions of the EDFA. The signal processor 8 includes power control means constituted by a digital input feed-forward derivative controller 10 and a digital output power set point calculator 12, both of which are responsive to the input power of the signal on input fibre 14 sensed by an input signal tap 4. The signal processor also includes a constant output power controller and proportional and integral compensated controller 18 which is responsive to the power sensed on output fibre 16 by an output signal tap 6 and the outputs of the controller 10 and calculator 12 to control the operating conditions of the EDFA.

In order to maximise the carrying capacity of optical fibre links, optical signals are generally transmitted in dense wavelength division multiplexed (WDM) form. That is to say, a transmission band, such as for example, the C band, is divided into a number of closely spaced wavelength channels and each signal to be transported is assigned to one of these particular channels. The channel signals are combined at a multiplexer into a multiplexed stream and the stream is transported by the fibres. A further out-of-band channel, an optical service channel (OSC), may be used to carry a signal encoded with link servicing information.

EDFAs and other optical amplifiers do not tend to have flat gain profiles; rather, gain tends to vary across a transmission band wavelength spectrum. Moreover, the profile may have a slope or gain tilt. Gain flattening techniques are used to make the gain as uniform as possible across any wavelength spectrum. However, despite this, EDFAs and other amplifiers still exhibit set point errors, that is, variations in gain to either side of a target gain, because of, for example, wavelength and temperature errors and gain ripple error. Set point gain errors also vary with wavelength such that the gain error on some of the wavelength channels may exceed acceptable deviation limits whereas the gain error on other channels may not. As a consequence, the channel loading, that is the wavelength channels present at any one time, may be such that one of more of the channels suffers unacceptable gain deviation and the overall gain deviation away from the target or set point gain is unacceptable. As a result of this one or more channels will exhibit low optical signal to noise ratio (OSNR). Moreover, if the link involves concatenated EDFAs or other optical amplifiers, the problem may be compounded, and degrade the bit error rate performance of the channel or channels or render it or them undetectable.

Attempts have been made to address this problem. One solution is to tune the gain to each amplifier during commissioning of the system by measuring each channels power output at each amplifier and correcting any excessive deviation. However, this is a costly process, requiring mobile test equipment, and is also very time consuming for the system installer. An alternative solution is to budget for all possible power deviations at the receiver. However, a typical transmitter to receiver path may include several EDFAs, which would require a receiver unit with a very large dynamic range or additional variable optical attenuators (VOAs)/ amplifiers, either of which add additional cost and complexity as well as noise into the path. Another alternative solution is to use dynamic gain flattening filters and channel modulators to equalise the gain of the concatenation However, these are relatively expensive products as well as adding complexity and additional attenuation into the path.

U.S. Pat. No. 5,513,029 (Roberts) describes the use in a WDM environment of what is termed an Analogue Maintenance Tone. This is a pseudo-analogue signal (slow modulation, typically 12 Kbits/s) which is coded on to each wavelength channel and can be detected at the receiver by collecting data over longer time period. If all the analogue signals are applied to a single detector, with a wide bandwidth so as to be able to detect all of the relevant wavelengths, it is possible to detect which channels are present via their signatures from the slowly modulated signal on their particular wavelength.

OBJECT OF THE INVENTION

An object of the invention is to overcome the problems of amplifier gain error in optical networks.

BRIEF DESCRIPTION OF THE INVENTION

According to a first aspect, the invention provides an amplifying module for an optical network, comprising a fibre amplifier for amplifying a multiplexed optical stream having a plurality of wavelength channels, which fibre amplifier has a set point gain, the module having module control means controlling the operating conditions of the fibre amplifier, supplying means supplying to the module control means information representative of the channel loading condition, wherein, in response, the module control means adjusts the operating conditions of the fibre amplifier such that the fibre amplifier gain does not exceed an acceptable deviation limit away from a set point gain.

The representative information may have been collected locally, say at the node at which the module is located, or remotely, from further afield say at another node altogether, or from a global control element located within the system.

Alternatively, the information could be entered manually at any of these locations.

Preferably, the module control means stores a plurality of maps each representative of one channel loading condition and for each map there is a corresponding set point gain offset, and wherein the module control means compares the information indicative of the channels present with the plurality of maps so as to determine the amplifier adjustment The supplying means may comprise optical means. An optical signal may be encoded with channel loading condition information and the optical signal may be combined with the stream, and a filter may be provided for filtering out the optical signal from the stream. The optical signal may be a signal on the optical service channel which may be encoded with information on the channel loading condition. The modulation may be such that the signal is analogous to an analogue maintenance tone. Alternatively, the optical signal may be an analogue maintenance tone. At conversion means the filtered out signal may be converted to an electrical signal. At demodulation means the electrical signal may be demodulated to provide data indicative of the channels present.

The supplying means may comprise electrical means. The channel loading condition information is in text file or in other file electrical formal.

The control means may include an amplifier pump power control which adjusts the operating conditions of the fibre amplifier by altering the gain tilt of the fibre amplifier. The control means may include attenuation means which in addition to or instead of alteration to the gain tilt of the fibre amplifier adjusts the operating conditions of the fibre amplifier by internal loss adjustments.

According to a second aspect, the invention provides an optical fibre link including an amplifying module according to the first aspect of the invention.

According to a third aspect, the invention provides a node in an optical fibre link including an amplifying module according to the first aspect of the invention.

According to a fourth aspect, the invention provides a method of operating an amplifying module for amplifying a multiplexed optical signal stream having a plurality of wavelength channels comprising supplying information indicative of the channel loading condition and in response adjusting the operating conditions of the fibre amplifier such that the gain does not exceed an acceptable deviation limit away from the set point gain.

DRAWINGS

DESCRIPTION OF THE INVENTION

Figure 1:
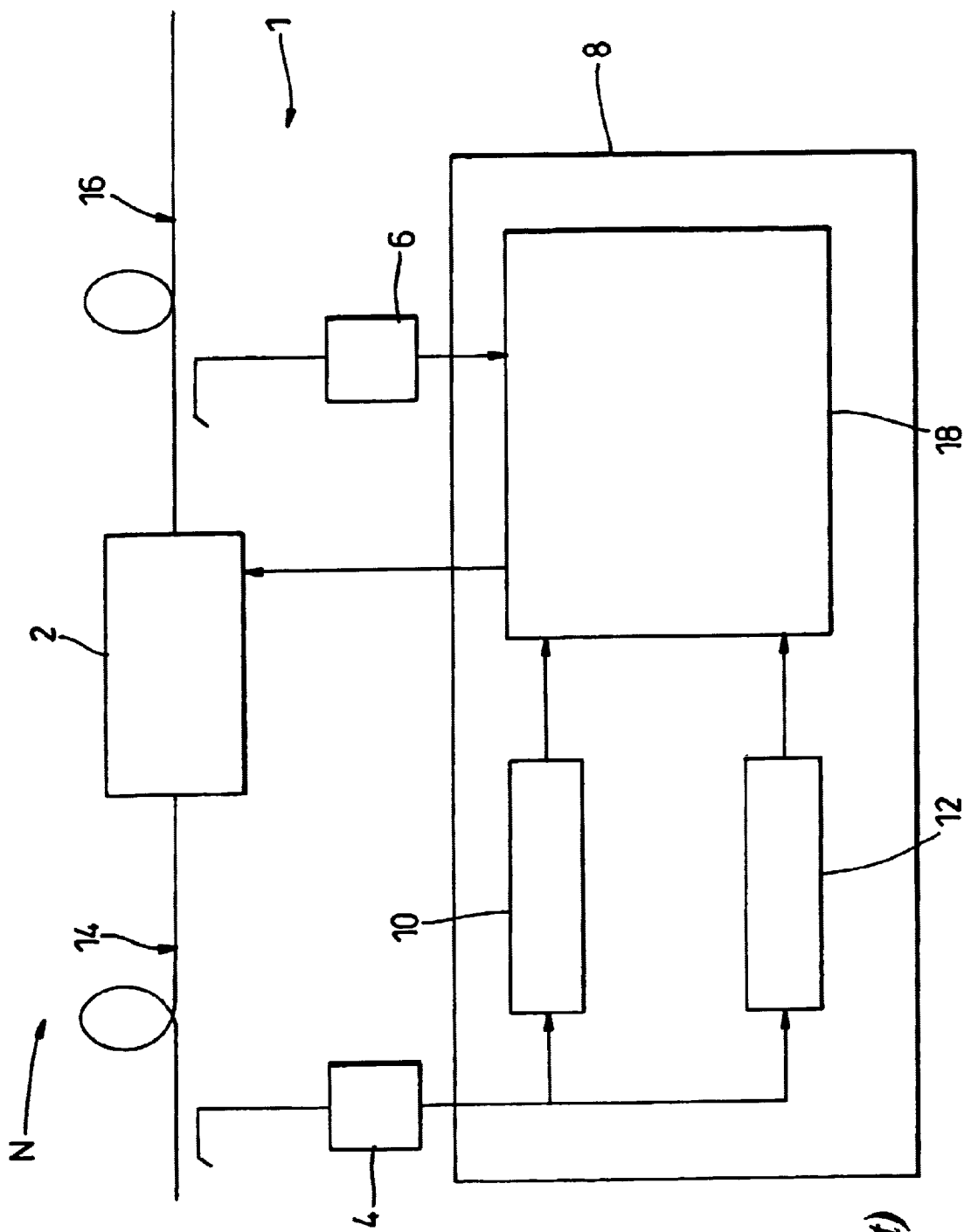
FIG. 1 is a schematic diagram of a prior art optical amplifying system.
Figure 2:
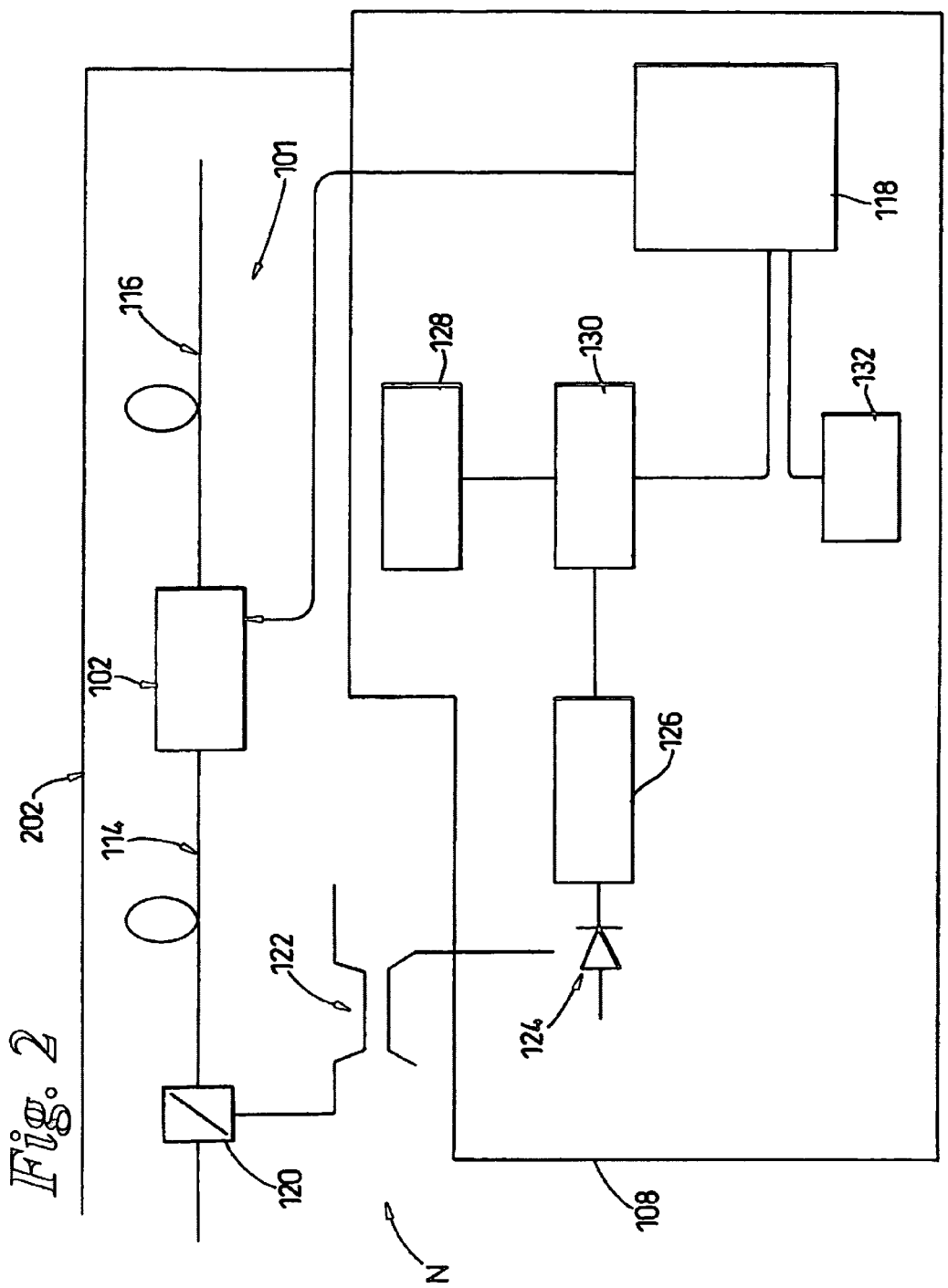
FIG. 2 is a schematic diagram of an exemplary amplifying system according to the invention.

With reference to FIG. 2, an amplifier module 101 according to the invention is situated at the node N in an optical fibre link between a transmitter (not shown) and a receiver (not shown). The module comprises all EDFA 102 having an erbium doped fibre component including a length of erbium doped fibre (not shown) pumped with light of appropriate wavelength from a semiconductor laser (not shown). The module 101 also comprises control electronics constituted by a signal processor 108 which controls the operating conditions of the module 101. In FIG. 2, some of the control electronics have been omitted for ease of understanding, but these are the same as the control electronics described with reference to FIG. 1.

An input fibre 114 carries encoded optical signals for amplification transmitted in dense wavelength division multiplexed form. That is to say, the transmission band, for example the C band, is divided into a number of closely spaced wavelength channels and each signal is assigned to one of these particular channels. The channel signals are combined at a multiplexer (not shown) into a multiplexed stream and the stream is sent along the fibre 114. At the EDFA 102 the stream is amplified. The EDFA has a target or set point gain, that is, a target amount by which the stream is preferably amplified. Some degree of variation to either side of the set point gain is acceptable. However, limits are put on the extent of acceptable deviation. At any one time, the stream may consist of any possible configuration of channels, or channel loading condition. Each loading condition may affect the set point gain variation and, in the case of some conditions, may result in an unacceptably large deviation.

Also sent along the fibre is an optical service channel (OSC) signal. This signal, carried on an out-of-band channel, is encoded with link servicing information. The OSC signal may also be encoded with channel information, in particular the in-band channels present at the node N. In other words, the OSC signal nay include information representative of the channel loading condition.

Normally, the OSC signal would be digitally encoded by modulation at relatively high bit rates, typically Mbits/s. At this speed, detection, although possible, would require complex electronics. More realistically feasible, and the preferred embodiment from the point of view of the invention, is to modulate the signal at a much slower rate, say 12 kbits/s, at which rate detection requires considerably less complex electronics. The signal is digitally encoded in a manner similar to an analogue maintenance tone.

An OSC filter 120 is provided in the input fibre 114. This filters out the OSC charmer signal and, via a tap 122, for example a 5% tap, enables the optical signal to be converted at conversion means, constituted by a photodiode 124, into an electrical signal. Next, the electrical signal has to be demodulated: The electrical signal is fed to a clock detection circuit 130 through a transimpedance amplifier 126. Also fed to the clock detection circuit 130 is a clock signal from a clock signal generator 128. From the clock detection circuit 130 emerges data indicative of the channels present in the signal for amplification. This data is supplied to the amplifier module power controller 118.

The signal processor 108 comprises memory means storing a series of "maps" each representative of one possible channel loading condition. The maps are predetermined by experimentation and entered into the signal processor 108. For each map there is a corresponding set point gain offset which is the amount by which the operating conditions of the EDFA 102 require adjustment in order to compensate for the set point gain variation caused by each loading condition. The power controller 118, responds by comparing the data with the maps in the memory means 132 until a match is found. Hence, by comparing the data output by the demodulation means, from the clock detection circuit 130, with each of the maps, the signal processor 108 is able to determine the operating conditions of the EDFA 102 required in order to compensate for the gain variation effects of the channel loading condition.

In particular, the effect is applied by altering the gain tilt or gain profile of the EDFA 102. This can be done by adjusting the module pump power, as the gain profile and therefore the gain tilt may vary with power, and/or by internal loss adjustments, say with variable optical attenuators (VOAs). The power can be adjusted by means of the power controller 118 within the signal processor 108.

Alternatively, electrical communication links 202 are generally provided between nodes. Included in the information carried on link 202 may be an indication of the channel loading conditions. For instance, the information could be present in the form of a text or other file. By tapping into the link, the text or other file could be downloaded into the signal processor 108 and using that information the necessary compensatory adjustments to the operating conditions can be made.

Figure 3:
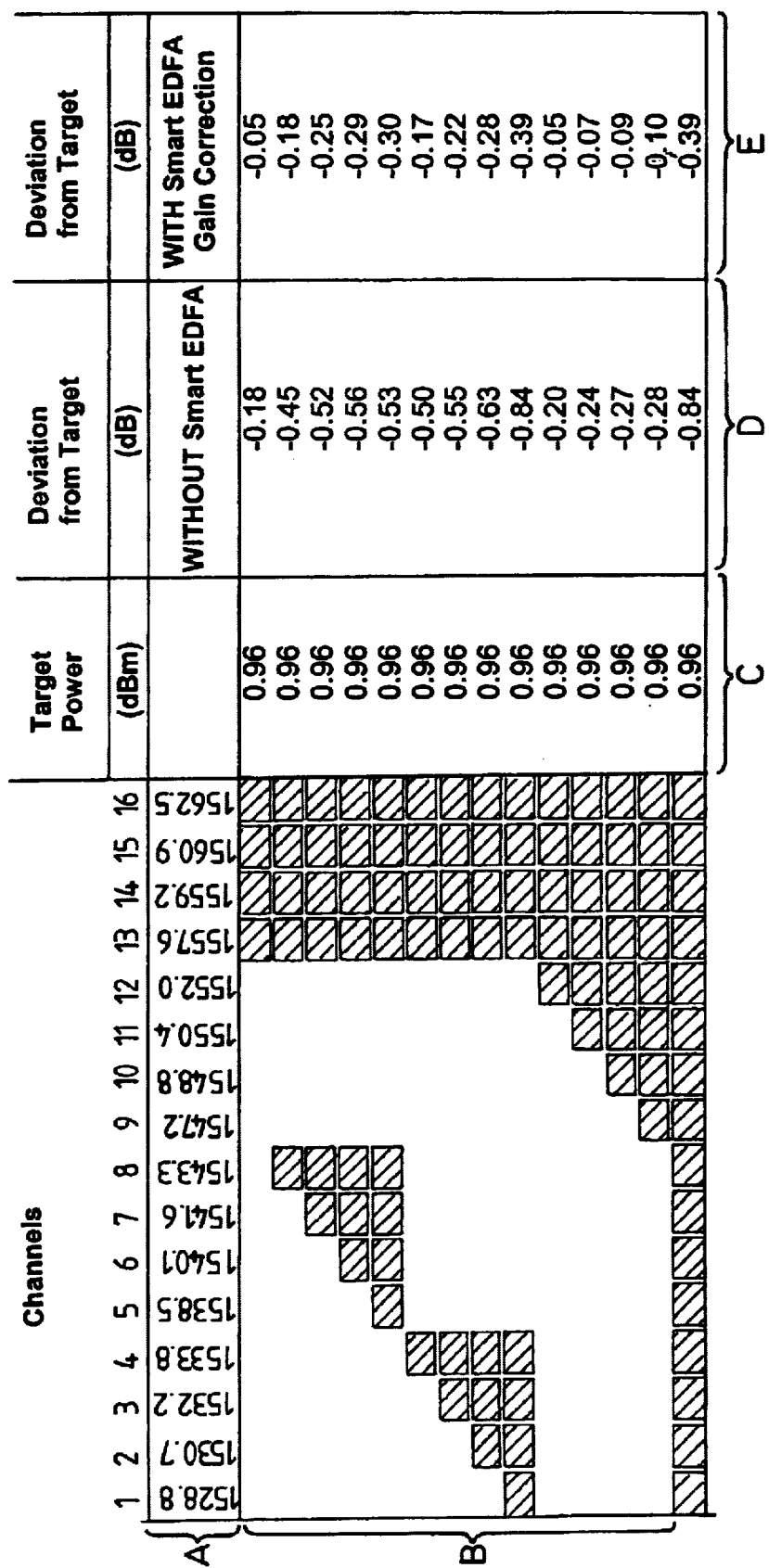
FIG. 3 is a table of comparative values for a prior art system and a system according to the invention.

With reference to FIG. 3, the benefits of a module according to the invention are compared to a prior art module. In each case, the module has been subjected to a series of loading conditions, and the power deviation is measured for each condition. Each of the channels is indicated in row A and each row of matrix B indicates a channel configuration; those channels present are indicated by a block in the column corresponding to the appropriate channel. A black block indicates a channel in use and a grey block indicates a channel in use with the worst power deviation for that configuration. Column C identifies the target power for each condition, which happens to be the same at 0.96 dBm. Column D identifies, for a prior art module, the power deviation from the target of each channel loading condition. Column E identifies, for a module according to the invention, the gain deviation from the target of each channel loading condition. As can be seen for each channel loading condition, there is a significant improvement in the gain deviation for the module according to the invention as against the prior art. For example when channels 4 and 13–16 are loaded, the power deviation for the prior art system is 0.5 dB whereas for the system according to the invention the deviation is 0.17 dB, which is within the acceptable deviation limit thereby resulting in an acceptable OSNR.

What is claimed is:

1. An amplifying module for an optical network comprising
   a fibre amplifier for amplifying a multiplexed optical stream input that has a plurality of channels each at a different wavelength;
   a controller controlling the gain of the fibre amplifier to achieve a gain whose deviation from a set point gain is below a predetermined level,
   wherein the controller determines from operating conditions of the fibre amplifier and from the channel configuration of the input a set point gain adjustment to set the gain of the fibre amplifier.

2. A module according to claim 1, wherein the controller comprises a memory for storing a plurality of maps each representative of one channel configuration and for each map a corresponding set point gain adjustment, wherein the controller compares the channel configuration with the plurality of maps to determine the set point gain adjustment.

3. A module according to claim 1, wherein the channel configuration of the input is communicated to the controller via an optical signal.

4. A module according to claim 1, wherein the channel configuration of the input is communicated to the controller via electrical means.

5. A module according to claim 3, wherein an optical signal is encoded with channel configuration information and the optical signal is combined with the optical multiplexed stream, and a filter is provided for filtering out the optical signal from the optical stream.

6. A module according to claim 3, wherein an optical signal is supplied on an optical service channel.

7. A module according to claim 3, wherein an optical signal is an analogue maintenance tone carried by the multiplexed optical stream.

8. A module according to claim 5 comprising a converter to convert said filtered out optical signal to an electrical signal.

9. A module according to claim 8 wherein at demodulation means the electrical signal is demodulated to provide data indicative of the channel configuration.

10. A module according to claim 4 wherein the information is in a text file or in another file electrical format.

11. A module according to claim 1, comprising an amplifier pump power controller which controls the gain of the fibre amplifier by altering the gain tilt of the fibre amplifier.

12. A module according to claim 11, comprising an optical attenuator which in addition to or instead of alteration to the gain tilt of the fibre amplifier adjusts the gain of the fibre amplifier by internal loss adjustments.

13. An optical fibre link including an amplifying module for an optical network comprising:
   a fibre amplifier for amplifying a multiplexed optical stream input that has a plurality of channels each at a different wavelength;
   a controller controlling the gain of the fibre amplifier to achieve a gain whose deviation from a set point gain is below a predetermined level,
   wherein the controller determines from operating conditions of the fibre amplifier and from the channel configuration of the input a set point gain adjustment to set the gain of the fibre amplifier.

14. A node in an optical fibre link including an amplifying module for an optical network comprising:
   a fibre amplifier for amplifying a multiplexed optical stream input that has a plurality of channels each at a different wavelength;
   a controller controlling the gain of the fibre amplifier to achieve a gain whose deviation from a set point gain is below a predetermined level,
   wherein the controller determines from operating conditions of the fibre amplifier and from the channel configuration of the input a set point gain adjustment to set the gain of the fibre amplifier.

15. A method of operating an amplifying module for amplifying a multiplexed optical signal stream having a plurality of wavelength channels comprising supplying information indicative of the channel configuration and in response adjusting the operating conditions of the fibre amplifier such that the gain deviation does not exceed a predetermined deviation limit away from the set point gain.

16. A method according to claim 15, wherein the information indicative of the channel configuration is supplied via an optical signal.

17. A method according to claim 15, wherein the information indicative of the channel configuration is supplied via an electrical signal.

18. A method according to claim 16, wherein the optical signal uses an optical service channel.

19. A method according to claim 16, wherein the optical signal uses an analogue maintenance tone.

20. A method according to claim 15, wherein the information indicative of the channel configuration is supplied from a local or remote node or from a global network element and/or is input manually locally or remotely.

* * * * *